(12) United States Patent
Albini

(10) Patent No.: US 11,430,950 B2
(45) Date of Patent: Aug. 30, 2022

(54) LOW RESISTANCE VIA CONTACTS IN A MEMORY DEVICE

(71) Applicant: Micron Technology, Inc., Boise, ID (US)

(72) Inventor: Giulio Albini, Draper, UT (US)

(73) Assignee: Micron Technology, Inc., Boise, ID (US)

(*) Notice: Subject to any disclaimer, the term of this patent is extended or adjusted under 35 U.S.C. 154(b) by 256 days.

(21) Appl. No.: 16/832,324

(22) Filed: Mar. 27, 2020

(65) Prior Publication Data

US 2021/0305506 A1    Sep. 30, 2021

(51) Int. Cl.
*H01L 45/00*  (2006.01)
*H01L 27/24*  (2006.01)

(52) U.S. Cl.
CPC ...... *H01L 45/1233* (2013.01); *H01L 27/2463* (2013.01); *H01L 45/06* (2013.01); *H01L 45/141* (2013.01); *H01L 45/16* (2013.01)

(58) Field of Classification Search
CPC ........................................................ H01L 45/16
See application file for complete search history.

(56) References Cited

U.S. PATENT DOCUMENTS

| | | | |
|---|---|---|---|
| 9,012,319 | B1 | 4/2015 | Choi et al. |
| 9,577,010 | B2 | 2/2017 | Sciarrillo |
| 10,147,875 | B1 | 12/2018 | Hansen et al. |
| 10,854,674 | B2 | 12/2020 | Ravasio et al. |
| 11,121,317 | B2 * | 9/2021 | Venigalla .......... H01L 21/76802 |

| | | | |
|---|---|---|---|
| 2001/0046784 | A1 | 11/2001 | Broekaart et al. |
| 2010/0054030 | A1 | 3/2010 | Lowrey |
| 2011/0186797 | A1 | 8/2011 | Herner |

(Continued)

FOREIGN PATENT DOCUMENTS

| | | |
|---|---|---|
| CN | 110660807 A | 1/2020 |
| KR | 100881507 B1 | 2/2009 |

(Continued)

OTHER PUBLICATIONS

ISA/KR, International Search Report and Written Opinion of the International Searching Authority, Int'l Appl. No. PCT/US2020/063415, dated Mar. 18, 2021, Korean Intellectual Property Office, Seo-gu, Daejeon, Republic of Korea, 11 pgs.

(Continued)

*Primary Examiner* — Mounir S Amer
(74) *Attorney, Agent, or Firm* — Holland & Hart LLP

(57) ABSTRACT

Methods, systems, and devices for low resistance via contacts in a memory device are described. A via may be formed so as to protrude from a surrounding material. A barrier material may be formed above an array area and also above the via. After a first layer of an access line material is formed above the barrier material, a planarization process may be applied until the top of the via is exposed. The planarization process may remove the access line material and the barrier material from above the via, but the access line material and the barrier material may remain above the array area. The first layer of the access line material may protect the unremoved barrier material during the planarization process. A second layer of the access line material may be formed above the first layer of the access line material and in direct contact with the via.

18 Claims, 9 Drawing Sheets

(56) References Cited

U.S. PATENT DOCUMENTS

| | | |
|---|---|---|
| 2012/0156871 A1 | 6/2012 | Sinha |
| 2013/0095634 A1 | 4/2013 | Takahashi et al. |
| 2015/0064899 A1 | 3/2015 | Ji et al. |
| 2015/0287916 A1 | 10/2015 | Campbell et al. |
| 2017/0117327 A1* | 4/2017 | Terai .................... H01L 27/2427 |
| 2017/0162627 A1 | 6/2017 | Bernasconi et al. |
| 2019/0043807 A1 | 2/2019 | Redaelli et al. |
| 2019/0043924 A1* | 2/2019 | Conti .................... H01L 27/2463 |
| 2020/0051624 A1 | 2/2020 | Economy et al. |
| 2020/0243642 A1 | 7/2020 | Fukuo |
| 2020/0266338 A1 | 8/2020 | Peng et al. |
| 2021/0013396 A1 | 1/2021 | Wang et al. |

FOREIGN PATENT DOCUMENTS

| | | |
|---|---|---|
| WO | 2019177632 A1 | 9/2019 |
| WO | 2019182657 A1 | 9/2019 |

OTHER PUBLICATIONS

Taiwan Intellectual Property Office, "Office Action," issued in connection with ROC (Taiwan) Patent Application No. 109143037, dated Sep. 10, 2021 (6 pages).

* cited by examiner

LOW RESISTANCE VIA CONTACTS IN A MEMORY DEVICE

BACKGROUND

The following relates generally to one or more memory systems and more specifically to low resistance via contacts in a memory device.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. Various types of memory architectures also exist. For example, an array of PCM memory cells may be arranged in a cross-point architecture to form a cross-point memory array.

DETAILED DESCRIPTION

Figure 1:
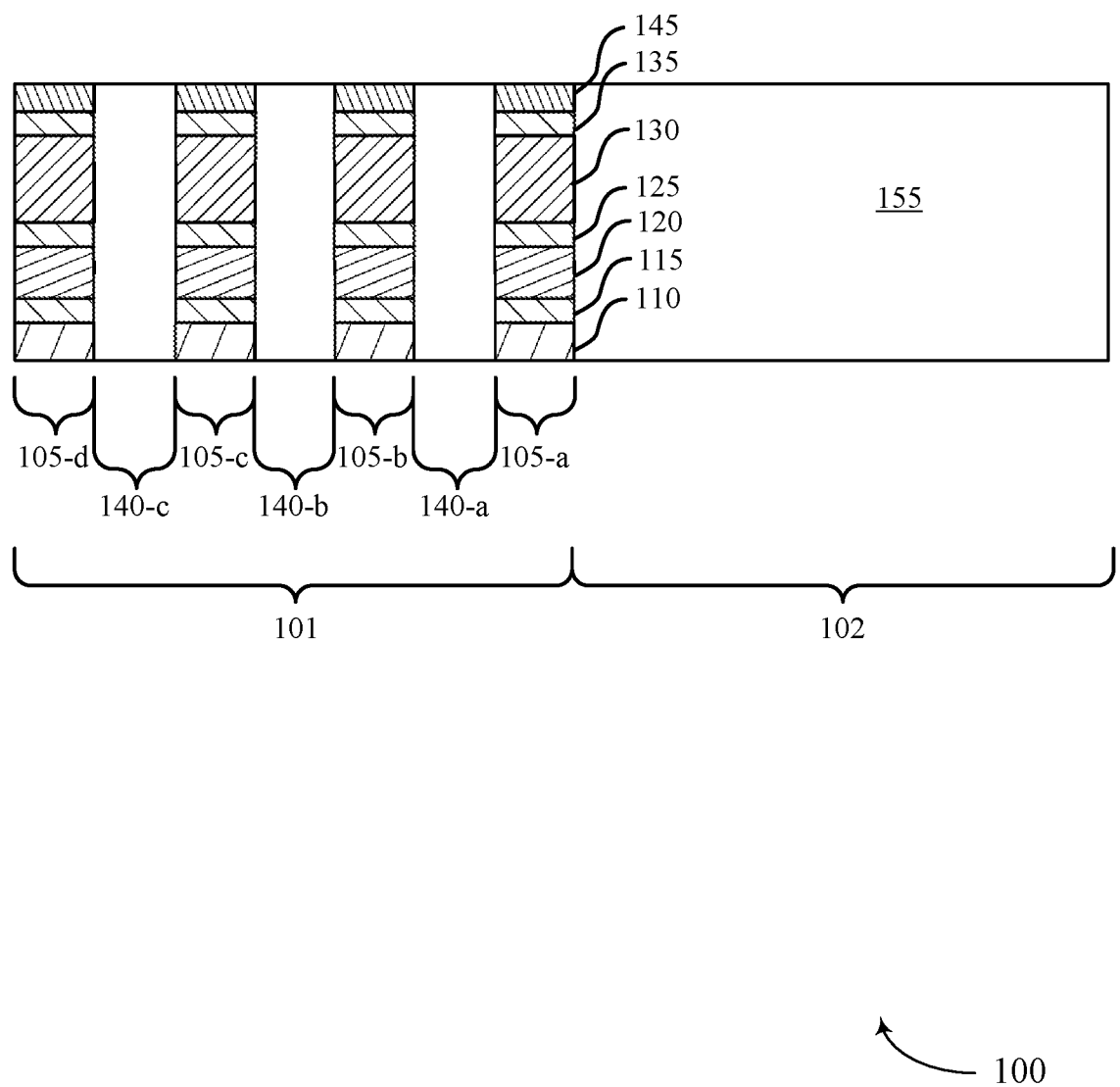
FIG. 1 illustrates an example of an intermediate state of fabrication that supports low resistance via contacts in a memory device in accordance with examples as disclosed herein.

In some cases, a barrier material may be disposed between memory cells (e.g., memory cell stacks) and an access line for the memory cells. For example, access lines may comprise tungsten (W) and the barrier material may comprise tungsten silicon nitride (WSiN). In some cases, the barrier material may be in direct contact with the access line. While the barrier material may be considered (conceptualized) as separate from the access line (e.g., a line of WSiN may be considered as separate from a tungsten access line with which the line of WSiN is in contact), the barrier material may alternatively be considered as included in (part of) the access line—e.g., the access line may be considered a multi-material (alternatively, multi-layer) access line, with the barrier material one of the multiple materials therein. Aspects of the description herein may discuss the barrier material as separate from the access line for clarity of discussion, but it is to be understood that the teachings herein and the scope of the claims appended hereto do not depend on whether the barrier material is considered as separate from an access line or as included in the access line.

The barrier material may have beneficial electrical or thermal properties with respect to interactions between the access lines and the memory cells of the array (e.g., may provide a reset current benefit or other benefit related to programming a memory cell or otherwise operating the memory cell), among other benefits that may be appreciated by one of ordinary skill in the art. In some cases, the barrier material may have a higher resistivity than the access line.

A memory device may include any number of vias, which may be conductive (e.g., metal) structures that pass through one or more layers of the stack and connect structures at one layer of the stack with structures at another layer of the stack (e.g., vias may connect access lines with corresponding drivers, which may be below the memory array). In some cases, a barrier material may be formed (e.g., deposited) as a blanket layer (sheet) over a wafer or die, and thus above both an array area (portion of the material stack in which a memory array is formed) and a neighboring via area (portion of the material stack in which one or more vias are formed). For example, for any number of reasons (e.g., cost, complexity), it may be impractical or otherwise undesirable to form the material only over the array area.

An access line material (a material from which access lines may be formed, such as W, for example) may subsequently also be deposited or otherwise formed above the barrier material so as to also be above the array area and the via area (e.g., the access line material may also be formed as a blanket layer. Access lines may be subsequently be formed from the access line material so as to be located above or otherwise coupled with the vias, but if the barrier material remains above the vias, the barrier material may introduce unwanted resistance into the contacts between the access lines and the vias. Thus, removing the barrier material from above vias and placing the vias in direct contact with the access line material may provide for lower resistance contacts and thereby improve the performance of the memory device.

As described herein, aspects of memory device formation may result in a via that at least temporarily (e.g., at least at one stage of fabrication) protrudes from one or more materials surrounding the via, such that a top surface of the via is at least temporarily above a top surface of the one or more surrounding materials, with one or more sidewalls of the via exposed. For example, the via may be surrounded by (e.g., formed in) a dielectric material, and the via may at least temporarily protrude above a top surface of the dielectric material.

A barrier material (e.g., WSiN) may be formed such that the barrier material initially covers the top surface of a via (e.g., a protruding portion of the via). A first layer of an access line material (e.g., W) may be formed above the barrier material, including above the protruding portion of the via. A planarization process (e.g., a chemical-mechanical polishing (alternatively, chemical-mechanical planarization) process) may then be used to remove both the first layer of the access line material and the barrier material from above the via, exposing the top surface of the via, while the barrier material and at least some of the first layer of the access line material remains above the array area. A second layer of the access line material may then be formed above (e.g., in contact with) the first layer of the access line material and in direct contact with the via. Forming the first layer of the access line material before the planarization process that removes the barrier material (along with the first layer of the access material) from above the via may beneficially protect the barrier material that remains above the array area from degradation (e.g., contamination) due to the planarization process, or exposure to the environment, among other benefits that may be appreciated by one of ordinary skill in the art.

Features of the disclosure introduced above are further described below in the context of the example fabrication techniques of FIGS. 1-6. These and other features of the disclosure are further illustrated by and described with reference to the flowcharts of FIGS. 7-9 that relate to the low resistance via contacts in a memory device.

Various techniques may be used to form materials or components shown in 1-5 below. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or CMP.

FIG. 1 illustrates an intermediate stage 100 of fabrication that supports low resistance via contacts in a memory device in accordance with examples as disclosed herein. FIG. 1 and other examples explained herein may relate to a so-called crosspoint (XP) architecture in which access lines at different levels (layers) of a memory device are arranged in intersecting rows and columns, with memory cells disposed between intersecting access lines. It is to be understood, however, that the teachings herein may be applied in the context of any memory architecture. Similarly, FIG. 1 and other examples explained herein may relate to chalcogenide-based memory cells, but is to be understood that the teachings herein may be applied in the context of a memory device with any type of memory cells. As just one non-limiting alternative example, the teachings described herein may be applied in the context of a NAND Flash memory device, for example.

FIG. 1 includes a schematic depiction of a set of materials from which a memory array and other aspects of a memory device may be formed. The set of materials may include any number of memory cell stack structures 105, any number of isolation regions 140, and dielectric material 155. The memory cell stack structures 105 and isolation regions 140 may be located within an array region 101, which may be above a corresponding array area of a substrate (not shown).

In some cases, the memory cell stack structures 105 and isolation regions 140 may comprise (or be included in) and may be referred to as a set of materials for a memory array, which may alternatively refer to any collection of materials from which a memory array may eventually be formed. The dielectric material 155 may be located within a via region 102, which may be above a corresponding area of the substrate.

A memory cell stack may refer to a stack of materials that collectively form a memory cell, and a memory cell stack structure 105 may refer to a structure from which any number of individual memory cell stacks may be formed. In some cases, each material included in a memory cell stack structure 105 may have been previously formed (prior to stage 100) as a blanket layer over the entire surface area of the substrate (e.g., over the entire surface area of a die or wafer). As of stage 100, the materials in the memory cell stack structures 105 may have been patterned (e.g., through combination of masking and etching steps) into lines that extend into and out of the page. That is, each memory cell stack structure 105 may extend into and out of the page as composite line of materials. Through subsequent patterning, including as described herein, the memory cell stack structures may later be patterned such that multiple memory cell stacks (e.g., pillar-shaped memory cell stacks) are ultimately formed from each memory cell stack structure 105 depicted in FIG. 1. Though reference numbers are provided in FIG. 1 for the materials included in only one memory cell stack structure 105, it is to be understood that this is for clarity of illustration only, and that like-shaded materials in different memory cell stack structures 105 may comprise the same materials.

A memory cell stack structure 105 may include metal material 110. Metal material 110 may be or may be included in an access line (e.g., a word line or a bit line, either of which may alternatively be referred to as a select line, and which may alternatively be respectively referred to as a row line or a column line; a bit line may alternatively be referred to as a digit line) for subsequently formed memory cells. Metal material 110 may comprise a metal (e.g., W) or other highly conductive material.

A memory cell stack structure 105 may also include a first electrode material 115 above (e.g., in contact with) metal material 110. The first electrode material 115 may be used to form one or more bottom electrode components, for example bottom electrodes respectively included in individual memory cell stacks. The first electrode material 115 may comprise carbon, for example.

A memory cell stack structure 105 may also include a selector material 120 above (e.g., in contact with) the first electrode material 115. The selector material 120 may be used to form one or more selection components, for example selector components respectively included in individual memory cell stacks. In some cases, the selector material 120 may comprise a chalcogenide material. The chalcogenide material may be configured to remain an amorphous state and may function as a diode (e.g., a snapback diode) when operating a subsequently formed memory device.

A memory cell stack structure 105 may also include a second electrode material 125 over the selector material 120. The second electrode material 125 may be used to form one or more middle electrode components, for example middle electrodes respectively included in individual memory cell stacks. The second electrode material 125 may comprise carbon, for example.

A memory cell stack structure 105 may also include a storage material 130 over the second electrode material 125.

The storage material 130 may be used to form one or more storage components, for example storage components respectively included in individual memory cell stacks. In some cases, the storage material 130 may comprise a chalcogenide material. The storage material 130 may be the same as or different (e.g., a different chalcogenide alloy) than the selector material 120. Though the example of FIG. 1 illustrates the storage material 130 as above the selector material 120, the positions of the storage material 130 and selector material 120 may be swapped in some examples. Further, in some examples, a memory cell stack and corresponding memory cell stack may lack a separate selector material 120 and the second electrode material 125, and the storage material 130 may be self-selecting (e.g., may be programmed using voltages of different polarities, as opposed to through phase change techniques as in some examples in which the selector material 120 is present).

A memory cell stack structure 105 may also include a third electrode material 135 over the storage material 130. The third electrode material 135 may be used to form one or more top electrode components, for example top electrodes respectively included in individual memory cell stacks. The third electrode material 135 may comprise carbon, for example.

In some cases, one or more of electrode materials 115, 125, and 135 may consist of two sub-layers (not shown), and thus an electrode formed therefrom may be referred to as a bi-layer electrode. In this case, at least one sub-layer may include carbon and may be referred to as a carbon-based material. Electrode materials 115, 125, and 135 may be formed, for example, by deposition techniques such as PVD, CVD, or ALD, among other deposition techniques.

A memory cell stack structure 105 may also include a dielectric material 145 over the third electrode material 135. The dielectric material 145 may be a nitride or an oxide, for example. In some cases, the dielectric material 145 may be a sacrificial layer and may not be present in a completed memory device, or may be present in a reduced amount relative to stage 100.

Isolation regions 140 may be between the memory cell stack structures 105 so as to separate and isolate each memory cell stack structure 105 from any immediate neighboring (adjacent) memory cell stack structure. An isolation region 140 may be formed using various etching or other removal techniques (e.g., which may also form the memory cell stack structures 105 from a stack of blanket layers of the materials within the memory cell stack structures 105), which may include the use of photomasks and photolithography to define the features as necessary followed by the use of one or more deposition techniques to fill each isolation region 140 a dielectric material. After subsequent processing, the isolation regions 140 and thus the dielectric material therein may surround individual memory cell stacks formed from the memory cell stack structures 105. In some cases, the dielectric material in the isolation regions 140 may be different than the dielectric material 145. For example, the dielectric material in the isolation regions 140 may be an oxide, and the dielectric material 145 may be a different oxide or a nitride.

The dielectric material 155 in the via region 102 may be the same as or different than the dielectric material in the isolation regions 140. The dielectric material 155 also may be the same as or different than the dielectric material 145. As one example, the dielectric material in the isolation regions 140 may be an oxide, the dielectric material 155 may be a second oxide, and the dielectric material 145 may be a nitride.

The space occupied by the dielectric material 155 may have previously included any number of other materials or structures, such as any number memory cell stack structures 105. For example, the materials included in the memory cell stack structures 105 may have been formed as blanket layers or otherwise may have previously occupied the via region 102, and in some cases, additional memory cell stack structures 105 may have previously been patterned within the via region 102. The material or structures previously within the space occupied by the dielectric material 155 may have been etched away or otherwise removed, however, using any suitable technique, such as the various removal techniques described herein.

In some cases, the material or structures previously within the space occupied by the dielectric material 155 may have been removed based on a masking step that may be referred to as a chop mask, which may serve to define boundaries of array regions 101 (and thus memory arrays) and via region 102 between or otherwise outside of array areas. For example, removing the material or structures previously within the space occupied by the dielectric material 155 may have created a void (e.g., a trench) that may have then been filled with the dielectric material 155. The dielectric material 155 may have been deposited or otherwise formed using any suitable technique, such as the various formation techniques described herein.

Figure 2:
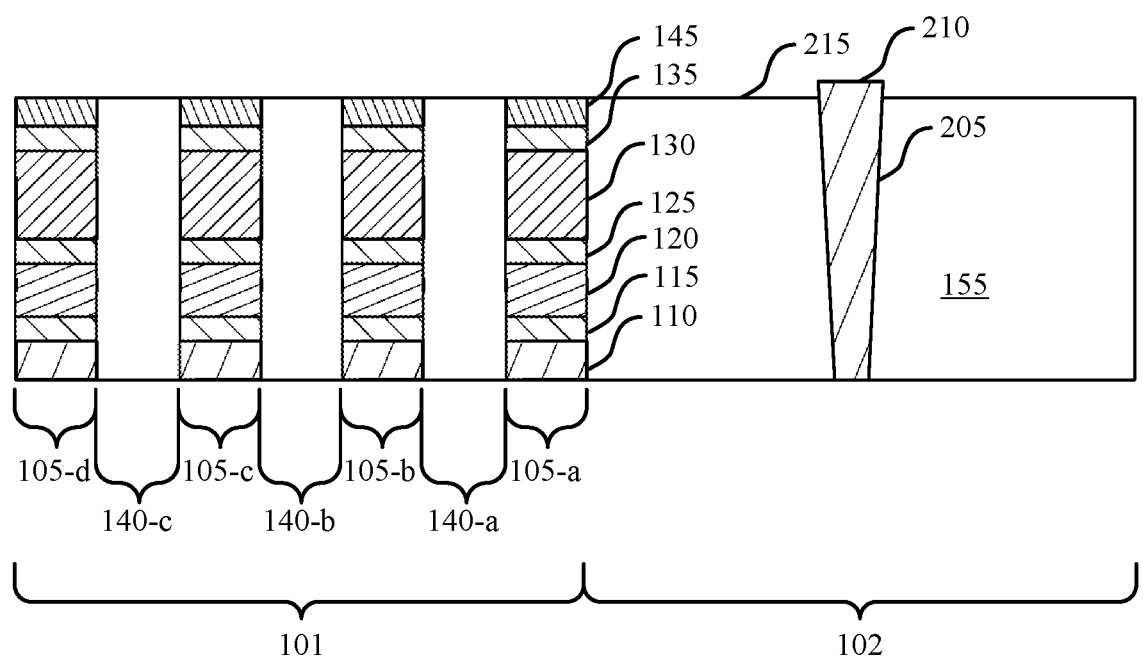
FIG. 2 illustrates an example of an intermediate stage of fabrication that supports low resistance via contacts in a memory device in accordance with examples as disclosed herein.

FIG. 2 illustrates an example of an intermediate stage 200 of fabrication that supports low resistance via contacts in a memory device in accordance with examples as disclosed herein. Stage 200 may be subsequent to stage 100 as described herein with reference to FIG. 1.

A via 205 may be formed within the via region 102. To form the via 205, a portion of the dielectric material 155 may be etched or otherwise removed (e.g., based on mask for the via 205) using any suitable technique, such the various removal techniques described herein. A space (e.g., hole, void) may thereby be formed within the dielectric material 155, and a via material then may be deposited or otherwise formed in the space to form the via 205. The via 205 thus may be surrounded by the dielectric material 155. Further, the dielectric material 155 (possibly along with any number of other materials) may be between the via 205 and the set of materials for the memory array. The via material may be tungsten (W), as one example, or a combination of different conductive materials (e.g., a metal nitride and a metal, such as tungsten nitride and tungsten, or titanium nitride and tungsten), as examples. Alternatively, the via material may be another metal or another conductive material. The space and thus the via 205 may extend through the dielectric material 155. In some cases, a top (upper) surface 210 of the via 205 as initially formed may be the same (or at least substantially the same) height as a top (upper) surface 215 of the dielectric material 155. In other example, the top surface 210 of the via may extend above a top surface 215 of the dielectric material 155.

In some cases, the via 205 may be formed above any number of other vias, which may be of aligned (e.g., coaxial) with the via 205 but included in (e.g., extending through) other layers below those shown in FIG. 2. Thus, any number of vias 205 may be connected to collectively form an interconnect that passes through any number of layers and materials within the memory device. Additionally or alternatively, access lines formed from the metal material 110 may be aligned with and coupled with vias that connect such access liens to one or more structures (e.g., drivers) below the metal material 110. Further, access lines formed from the metal material 110 may be in direct contact with such vias, may be in contact with (or alternatively be considered to include) a barrier material, and may otherwise have been formed in accordance with the techniques described herein for forming an access line above the memory cell stack structures 105.

Also, though only one via 205 is shown for illustrative clarity, it is to be understood that any number of like or similar vias may be formed concurrently in the dielectric material 155. For example, a group of vias may be located in a same via region as the via 205 and at a same layer or level of the memory device (e.g., also formed within the dielectric material 155 and the via region 102). Further, though the via 205 is described and illustrated as formed in and surrounded by the dielectric material 155, it is to be understood that the via 205 may alternatively be formed in or surrounded by any other type of material, including a collection of multiple materials.

In some cases, the top surface 215 of the dielectric material 155 and the top surface 210 of the via 205 (e.g., along with the top surfaces of other materials in FIG. 2 with exposed top surfaces) may be polished (e.g., using a CMP process) after the via 205 is formed. In some cases, this polishing may cause a portion of the via 205 to protrude from the surrounding dielectric material 155. For example, polishing or etching the top surface 215 of the dielectric material 155 and the top surface 210 of the material included in the via 205 may remove the dielectric material 155 and the material included in the via 205 at different rates. For example, the dielectric material 155 may be removed at a greater (faster) rate than the material included in the via 205, which may result in the protruding portion of the via 205.

Additionally or alternatively, however, a polishing (e.g., CMP) process may be applied to the top surface 215 of the dielectric material 155 and the top surface 210 of the via 205 (e.g., along with the top surfaces of other materials in FIG. 2 with exposed top surfaces) that removes the material included in the via 205 at a greater (faster) rate than the dielectric material 155. For example, a metal-CMP configured to remove the material included in the via 205 at a fast rate than the dielectric material 155 may be applied, which may result in the top surface 210 of the via 205 being lower than and thus recessed (e.g., dished) relative to the top surface 215 of the dielectric material.

In some cases—either in addition or in the alternative to one or both of the possible polishing processes described above—an etch may be applied at stage 200 to either cause the top surface 210 of the via 205 to protrude or to enhance an amount (height) by which the top surface 210 of the via 205 protrudes. For example a wet or dry etch with chemical selectively so as to etch the dielectric material 155 at a faster rate than the material in the via 205 may be applied.

Thus, the protruding portion of the via 205 may be formed by any combination of polishing or etching processes that, at least collectively, cause the height (e.g., first height) of the top surface 210 of the via 205 (e.g., protruding portion) to become greater than the height of the top surface 215 of the dielectric material 155 (e.g., because the top surface 215 of the dielectric material 155 may decrease in height, relative to the substrate, by a relatively greater amount than the top surface 210 of the via 205). Accordingly, one or more sidewalls of the via 205 may be exposed and extend above the top surface 215 of the dielectric material 155.

Though the example of FIG. 2 illustrates the top surface 210 of the via 205 as above (higher than) the uppermost portions of the memory cell stack structures 105 and isolation regions 140, it is to be understood that, in other examples, the upper surface of the via 205 be at a same height or below (lower than) the uppermost portions of the memory cell stack structures 105 or isolation regions 140. Also, though shown as at the same level (height), in some cases, the uppermost portions of the memory cell stack structures 105 may be higher than the uppermost portion so the isolation regions 140 (e.g., the isolation regions 140 may become dished between the memory cell stack structures 105). In some cases, for example, the top surface 215 of the dielectric material 155 within the via region that includes the via 205 may be recessed (dished) (e.g., due to a polishing or etching process) to a greater extent than the top surface of the dielectric material within an isolation region 140, and thus the via 205 may protrude from the dielectric material 155 without the upper surface of via 205 necessarily being at a greater height than the uppermost portions of the memory cell stack structures 105 (e.g., the top surface of the dielectric material 145). In some cases, the via 205 may protrude from the dielectric material 155 even if the top surface 210 of via 205 is at a lower height than the lowermost portions of the isolation regions 140.

Figure 3:
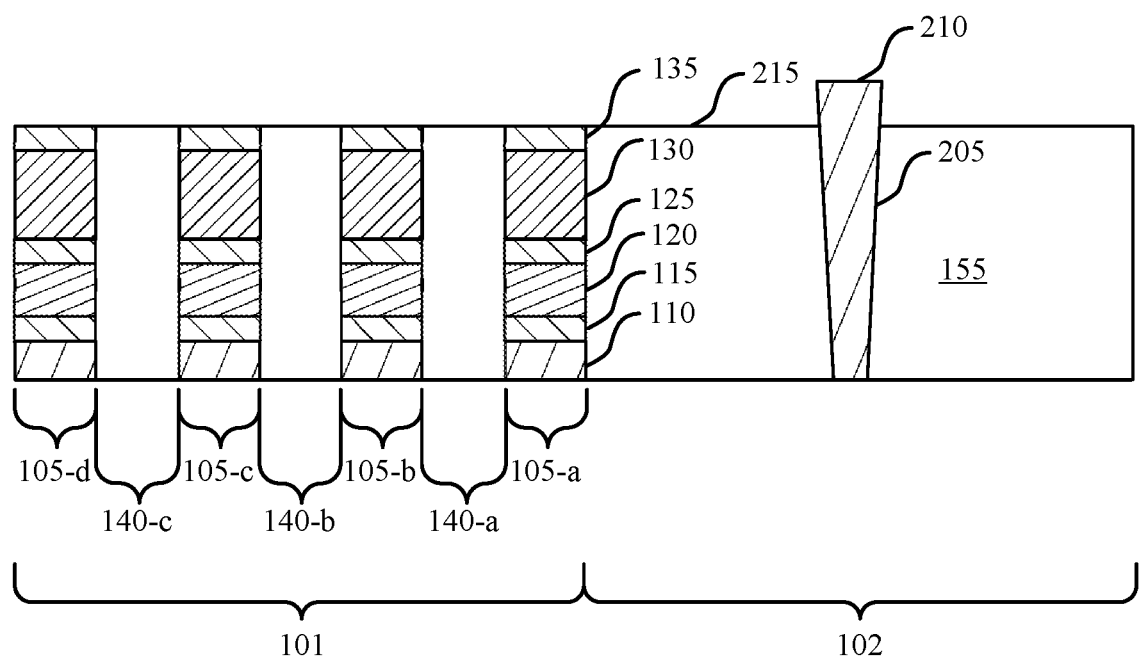
FIG. 3 illustrates an example of an intermediate stage of fabrication that supports low resistance via contacts in a memory device in accordance with examples as disclosed herein.

FIG. 3 illustrates an example of an intermediate stage 300 of fabrication that supports low resistance via contacts in a memory device in accordance with examples as disclosed herein. Stage 300 may be subsequent to stage 200 as described herein with reference to FIG. 2.

A polishing process (e.g., CMP) or other process may be applied that removes the dielectric material 145 from the memory cell stack structures 105. For example, the polishing or other process may be chemically selective or otherwise configured to remove the dielectric material 145 at a greater (faster) rate than one or more other materials shown in FIG. 3. In examples in which the dielectric material 145 is a nitride, for example, the polishing process may comprise a nitride CMP.

The polishing or etching process used to remove the dielectric material 145 may also remove a portion of the dielectric material 155, and in some cases may remove the dielectric material 155 and the material included in the via 205 at different rates. For example, the dielectric material 155 may be removed at a greater (faster) rate than the material included in the via 205, which may result in a height of the protruding portion of the via 205 relative to the top surface 215 of the dielectric material 155 being greater than before the dielectric material 145 is removed.

Figure 4:
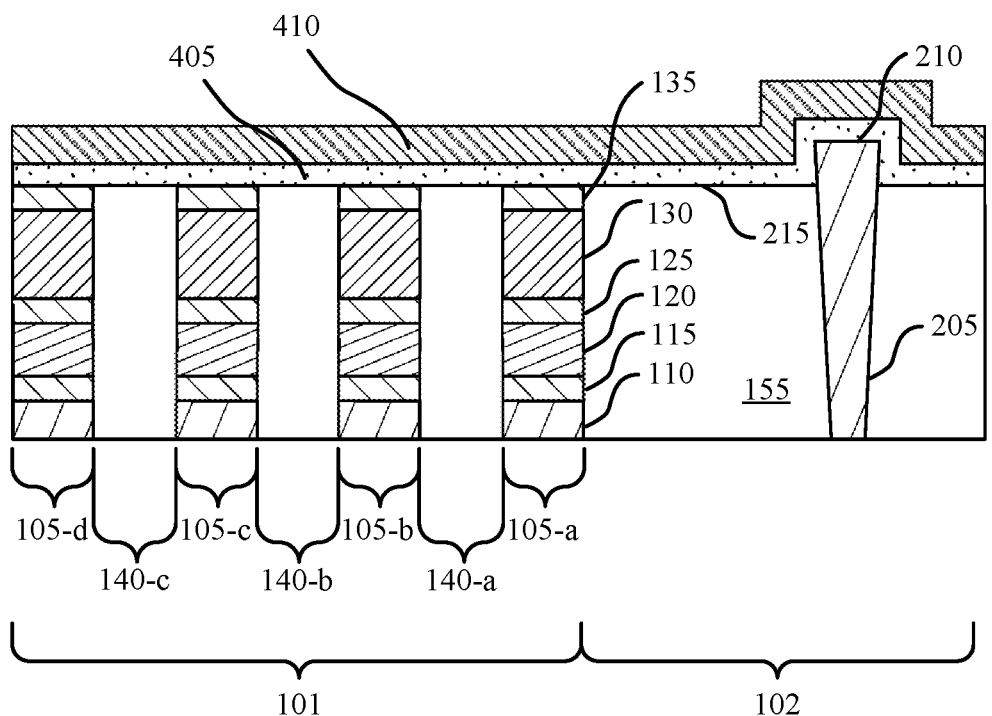
FIG. 4 illustrates an example of an intermediate stage of fabrication that supports low resistance via contacts in a memory device in accordance with examples as disclosed herein.

FIG. 4 illustrates an example of an intermediate stage of fabrication 400 that supports low resistance via contacts in a memory device in accordance with examples as disclosed herein. Stage 400 may be subsequent to stage 300 as described herein with reference to FIG. 3.

In some cases, barrier material 405 may be formed over the via 205, and possibly also over some or all of both the via region 102 and the array region 101. Barrier material 405 may be deposited or otherwise formed as a blanket layer, for example, and thus may be in direct contact with the top surfaces of the third electrode material 135, the dielectric material in the isolation region 140, the dielectric material 155, and the via 205.

Various techniques may be used to deposit barrier material 405. These may include, but are not limited to, PVD, CVD, MOCVD, sputter deposition, ALD, or MBE, among other thin film growth techniques. In some cases, barrier material 405 may comprise a nitride. For example, the barrier material 405 may comprise a metal nitride (e.g., tungsten nitride (WN) or titanium nitride (TiN)), a metal silicide (e.g., tungsten silicide (WSiX)), or a metal silicon nitride (e.g., tungsten silicon nitride (WSiN)). It is to be understood, however, that the barrier material 405 may alternatively include any other suitable barrier material. In some examples, barrier material 405 may provide a thermal barrier between the carbon of third electrode material 135 and a material deposited on top of barrier material 405 (e.g., a metal or other material for an access line, as discussed below in further detail).

In some examples, as initially formed, barrier material 405 may include a uniform thickness above the set of materials for the memory array, the dielectric material 155, and the via 205. The top surface of the barrier material 405 may mirror or otherwise have a similar topography as the profile of the top surfaces of the memory cell stack structures 105, isolation regions 140, the dielectric material 155, and the via 205, including the protruding portion of the via 205. For example, the barrier material 405 may be in contact with both the top surface 210 of the via 205 as well as one or more (e.g., all) sidewalls of the via, or otherwise in contact with all surfaces of the protruding portion of the via 205). The height (e.g., thickness) of the barrier material 405 (e.g., measured from the top surface 215 of the dielectric material 155) may be less than (e.g., one half or some other fraction of) the height of the top surface 210 of the via 205 relative to the top surface 215 of the dielectric material 155

The presence of the barrier material 405 above the array region 101 may have one or more benefits as described elsewhere herein or as otherwise may be appreciated by one of ordinary skill in the art. As one example, the presence of the barrier material 405 above the memory cell stack structures 105 may provide a reset current benefit or other electrical benefit related to programming the storage material 130 or otherwise operating the set of materials for the memory array. The presence of the barrier material 405 above the via 205 (e.g., above the via region 102), however, may have one or more drawbacks, such as increased resistance between the via 205 and any structure subsequently formed above the via 205 (e.g., a subsequently formed access line or other via 205 at a higher layer of the memory device) that is meant to be directly or indirectly coupled with the via 205.

In some cases, after the barrier material 405 is formed, first metal layer 410 may be formed over (e.g. in direct contact with) the barrier material 405. First metal layer 410 may be deposited or otherwise formed as a blanket layer, for example, and thus may be in formed above both the array region 101 and the via region 102. Various techniques may be used to deposit first metal layer 410. These may include, but are not limited to, PVD, CVD, MOCVD, sputter deposition, ALD, or MBE, among other thin film growth techniques.

In some cases, first metal layer 410 may be an access line material and may be any material suitable for including in an access line. For example, the first metal layer 410 may comprise a metal or a metal nitride such as tungsten, tungsten nitride, aluminum, tantalum, or molybdenum, or an alloy thereof. In some cases, the first metal layer 410 may include a refractory metal. It is to be understood, however, that while described as a metal layer for clarity of discussion, the first metal layer 410 may alternatively include any other suitable material for an access line.

In some examples, as initially formed, first metal layer 410 may include a uniform thickness above the barrier material 405. The top surface of the first metal layer 410 may mirror or otherwise have a similar topography as the profile of the top surface of the barrier material 405, including the protruding portion of the via 205. For example, the first metal layer 410 may be in contact with both the top surface barrier material of as well as one or more (e.g., all) sidewalls of a raised portion of the barrier material 405, where the raised portion of the barrier material 405 is due to the protrusion of the via 205. In some cases, the thickness of the first metal layer 410 may be greater than the thickness of the barrier material 405. However, the thickness of the first metal layer 410 may be thinner than the final desired thickness of an access line. In some cases, the combined thickness of the barrier material 405 and the first metal layer 410 may be greater than the height of the protruded portion of the via 205. The respective thicknesses of the barrier material 405 and of the first metal layer 410 may be configured such that, which the barrier material 405 and the first metal layer 410 are subsequently removed from above the via 205 (as described in greater detail elsewhere herein), at least some portion of the first metal layer 410 remains above the barrier material 405 within the array region 101.

As discussed elsewhere herein, the barrier material 405 may be considered as separate from or as included in a subsequently formed access line (e.g., an access line that includes the material of first metal layer 410). Forming a first layer of access line material (e.g., first metal layer 410) over the barrier material 405 may protect (e.g., seal) the barrier material 405 from damage or deterioration (e.g., oxidation) during later fabrication steps.

Figure 5:
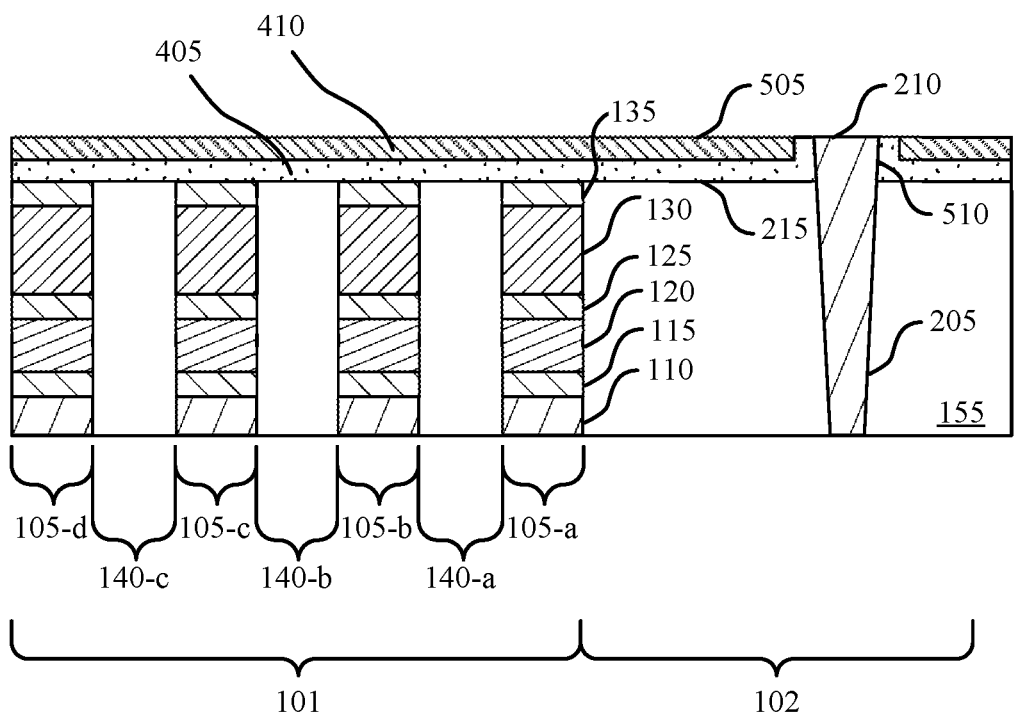
FIG. 5 illustrates an example of an intermediate stage of fabrication that supports low resistance via contacts in a memory device in accordance with examples as disclosed herein.

FIG. 5 illustrates an example of an intermediate stage 500 of fabrication that supports low resistance via contacts in a memory device in accordance with examples as disclosed herein. Stage 500 may be subsequent to stage 400 as described herein with reference to FIG. 4.

In some examples, after the barrier material 405 and first metal layer 410 are formed, a portion of the first metal layer 410 may be removed. For example, the top (upper) surface 505 of first metal layer 410 may be planarized or otherwise smoothened. Various techniques may be used to planarize top surface 505 of first metal layer 410. These may include but are not limited to CMP. In some cases, the top surface 505 of the first metal layer 410 (and, subsequently, a top surface of the barrier material 405) may be polished or otherwise processed (e.g., removed) until at least a top surface of the protruding via 205 is exposed. The first metal layer 410 may remain above the barrier material 405 within the array region 101 and also within the via region 102, other than the raised portion of the barrier material due to the protruding portion of the via 205. For example, at least some portion of the first metal layer 410 may remain above the array region 101 after the planarization process at least in part because the thickness of the barrier material 405 may be smaller than an amount by which the via 205 protrudes from the dielectric material 155 (e.g., smaller than a height of one or more sidewalls of the protruding portion of the via 205).

In some cases, after the portion of the first metal layer 410 is removed, the barrier material 405 may remain in contact with at least a portion of one or more sidewalls of the via 205. For example, a sidewall of the protruding portion of the via 205 may remain in contact with the barrier material 405. The barrier material 405 also may remain above the dielectric material 155. In such cases, a portion of the via 205 may come to be surrounded, at least in part, by the barrier material 405. After the planarization, the top surface 505 of the first metal layer 410 may be level with the top surface 210 of the via 205. In such cases, the height by which the via 205 protrudes from the dielectric material 155 may be equal to a combined thickness of the barrier material 405 and the remaining portion of the first metal layer 410. In some cases, the bottom surface of the first metal layer 410 may be lower than the top surface 210 of the via 205, and a portion of the barrier material 405 may be between the sidewall 510 of the via 205 and a surface (e.g., vertical surface) of the first metal layer 410, as shown by the "L" shaped cross section of the barrier material 405 in FIG. 5.

Removing the barrier material 405 and first metal layer 410 from above the via 205 may decrease resistance between the via 205 and any structure subsequently formed above the via 205 (e.g., a subsequently formed access line or other via 205) that is directly or indirectly coupled with the via 205, while avoiding additional costs, complexities, or other drawbacks that may be associated with forming the barrier material 405 and first metal layer 410 so as to not initially cover the via 205.

Although not shown for clarity of illustration, it will be understood that in some cases a memory device in accordance with the teachings herein may also include one or more additional materials (e.g., a liner) formed above or below barrier material 405 (e.g., as a blanket layer). For example, a liner material may be interposed between a bottom surface of barrier material 405 and the top surface of third electrode material 135. In some examples, as initially formed, the liner material may be interposed between a bottom surface of barrier material 405 and the top surface of the via 205 as well as the top surface of the dielectric material 155. Any such additional material may be removed from above the top surface of the via 205 using the same or similar processing operations as those described for removing the first metal layer 410 and the barrier material 405 from above the top surface of the via.

Figure 6:
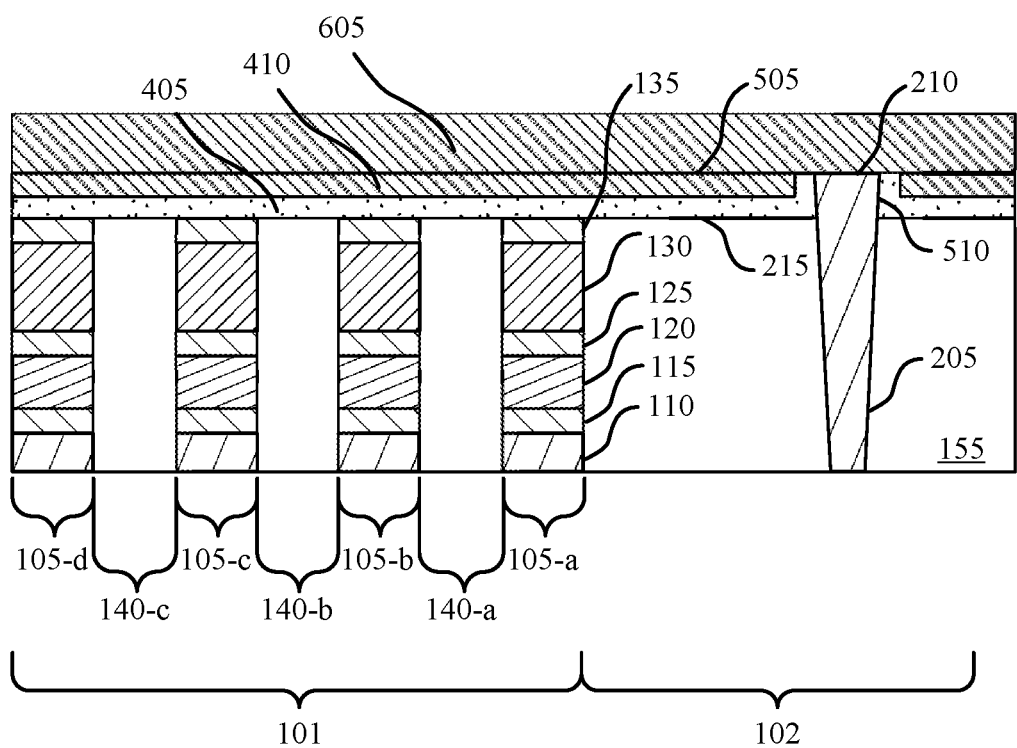
FIG. 6 illustrates an example of an intermediate stage of fabrication that supports low resistance via contacts in a memory device in accordance with examples as disclosed herein.

FIG. 6 illustrates an example of an intermediate stage 600 of fabrication that supports low resistance via contacts in a memory device in accordance with examples as disclosed herein. Stage 600 may be subsequent to stage 500 as described herein with reference to FIG. 5.

In some cases, a second metal layer 605 may be formed over the first metal layer 410. For example, second metal layer 605 may be in direct contact with top surface 505 (which may have been planarized or otherwise smoothened as described herein) of first metal layer 410. Various techniques may be used to form the second metal layer 605. These may include, but are not limited to, PVD, CVD, MOCVD, sputter deposition, ALD, or MBE, among other thin film growth techniques.

Second metal layer 605 may be an access line material and thus may be any material suitable for including in an access line. For example, the second metal layer 605 may comprise a metal or a metal nitride such as tungsten, tungsten nitride, aluminum, tantalum, or molybdenum, or an alloy thereof. In some cases, the second metal layer 605 may include a refractory metal. It is to be understood, however, that while described as a metal layer for clarity of discussion, the second metal layer 605 may alternatively include any other suitable material for an access line. The second metal layer may be the same material as or a different material than the first metal layer 410.

Any number of access lines may be formed from the first metal layer 410 and the second metal layer 605. For example, one access line formed from the first metal layer 410 and the second metal layer 605 may be in contact with the via 205, and other access lines formed from the first metal layer 410 and the second metal layer 605 may be in contact with other vias. An access line formed from the first metal layer 410 and the second metal layer 605 may comprise at least two sublayers.

In some cases, due to having previously removed the barrier material 405 and the first metal layer 410 from the top surface 210 of the via 205 as described with reference to FIG. 5, the second metal layer 605 may be in contact with the top surface 210 of the via 205. For example, the second metal layer 605 may extend from above the array region 101 to above the via 205 (e.g., the second metal layer 605 may be deposited or otherwise formed as a blanket layer). In some cases, the thickness of the second metal layer 605 may be greater than a thickness of the first metal layer 410. In some cases, the thickness of the second metal layer 605 may be configured such that a combined thickness of the second metal layer 605 and the first metal layer 410 yields a desired resistivity for an access line.

The direct contact between the second metal layer 605 and the via 205 may support a reduced contact resistance, thereby improving the overall memory device performance. For example, an access line (e.g., a bit line or a word line for the memory cells) may subsequently be formed from second metal layer 605 and first metal layer 410, and the access line may be in direct contact with the via 205, thereby reducing resistance between the access line and the via 205, and thus between the access line and any other structure that may be coupled with the via 205 (e.g., a driver for the access line). These and other fabrication techniques described herein may thus improve the behavior and performance of memory cells along with other benefits that may be appreciated by those of ordinary skill in the art.

After the second metal layer 605 is formed, an etch may be performed to form access lines that extend in a direction parallel to the page as shown in FIG. 6 in order to form access lines from the second metal layer 605 and first metal layer 410 as well as memory cell stacks (pillars) form the memory cell stack structures 105.

Although not shown for clarity of illustration, it will be understood that the illustrated array structures may be formed above or below other layers (e.g., over a substrate), which can include, among other things, various peripheral and supporting circuitry, and that the via 205 may couple the second metal layer 605 or a structure formed therefrom with a structure at a higher or lower layer. For example, complementary metal oxide semiconductor (CMOS) transistors may be incorporated into column and row driver circuitry and sense amplifier circuitry, and the via 205 may couple an access line formed in second metal layer 605 to a corresponding driver. In addition, the other layers may include one or more memory arrays, or "decks" of arrays—the structures illustrated in the examples of FIGS. 1-6 may correspond to one deck of a memory array and may be above or below any number of additional decks of the memory array.

After stage 600 and any number of other fabrication steps, a completed memory device may include an array of memory cells (e.g., each including one or more materials of the memory cell stack structures 105), a via 205 that extends through the dielectric material 155, a barrier material 405 above the array of memory cells and the dielectric material 155, and an access line (e.g., comprising first metal layer 410 and second metal layer 605) above the barrier material 405. The array structure may further include a second dielectric material that is different than the dielectric material 155 and disposed between memory cells of the array (e.g., in isolation regions 140). In such cases, the barrier material 405 may be in contact with the memory cells of the array and with the second dielectric material in the isolation regions 140.

The dielectric material 155 may be disposed between the array of memory cells and the via 205. In some cases, the via 205 may protrude from the dielectric material 155 by a height that is greater than a thickness of the barrier material 405 above the array of memory cells. The barrier material 405 may be in contact with a sidewall 510 of the via 205, and a portion of the barrier material 405 may be between the sidewall 510 of the via 205 and a portion of the access line (e.g., first metal layer 410 and second metal layer 605).

An access line may include a first sublayer (e.g., the first metal layer 410) and a second sublayer (e.g., second metal layer 605). In some cases, the height by which the via 205 protrudes from the dielectric material 155 may be equal to a combined thickness of the barrier material 405 and the first sublayer (e.g., first metal layer 410). The access line may extend from above the array of memory cells (above the array region 101) to above the via 205, and the access line may be in contact with a top surface of the barrier material 405, the top surface 215 of the dielectric material 155, and a top surface 210 of the via 205, including any subset or combination thereof. In some cases, a portion (e.g. a lower portion, or a lower surface) of the access line (e.g., of the first sublayer) may be lower than the top surface 210 of the via 205.

Figure 7:
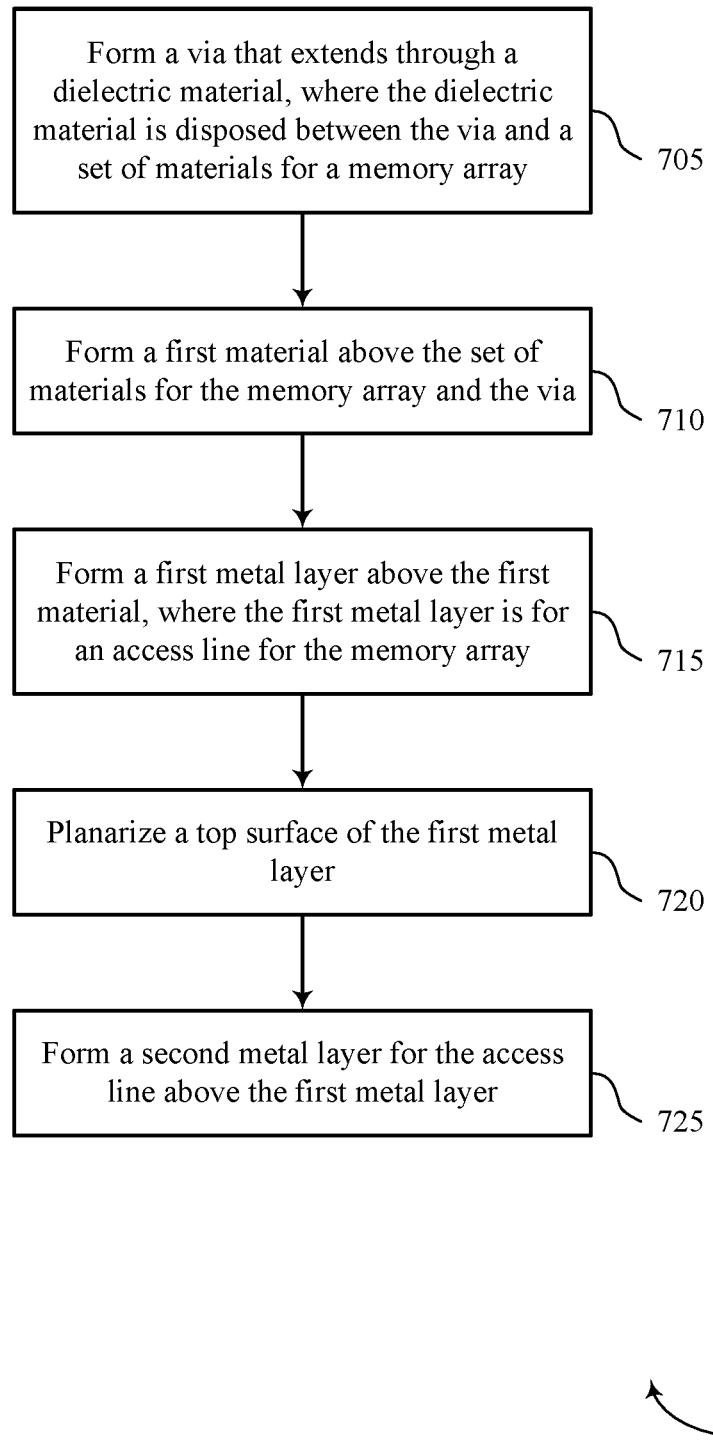
FIGS. 7 through 9 show flowcharts illustrating a method or methods that support low resistance via contacts in a memory device in accordance with examples as disclosed herein.

FIG. 7 shows a flowchart illustrating a method or methods 700 that supports low resistance via contacts in a memory device in accordance with aspects of the present disclosure. The operations of method 700 may be used to form a memory device or its components as described herein. For example, the operations of method 700 may be implemented by the fabrication techniques as described with reference to FIGS. 1-6.

At 705, a via that extends through a dielectric material may be formed, where the dielectric material is disposed between the via and a set of materials for a memory array. The operations of 705 may be performed according to the methods described herein. In some examples, aspects of the operations of 705 may be performed using fabrication techniques as described with reference to FIGS. 1-6.

At 710, a first material above the set of materials for the memory array and the via may be formed. The operations of 710 may be performed according to the methods described herein. In some examples, aspects of the operations of 710 may be performed using fabrication techniques as described with reference to FIGS. 1-6.

At 715, a first metal layer above the first material may be formed, where the first metal layer is for an access line for the memory array. The operations of 715 may be performed according to the methods described herein. In some examples, aspects of the operations of 715 may be performed using fabrication techniques as described with reference to FIGS. 1-6.

At 720, a top surface of the first metal layer may be planarized. The operations of 720 may be performed according to the methods described herein. In some examples, aspects of the operations of 720 may be performed using fabrication techniques as described with reference to FIGS. 1-6.

At 725, a second metal layer for the access line above the first metal layer may be formed. The operations of 725 may be performed according to the methods described herein. In some examples, aspects of the operations of 725 may be performed using fabrication techniques as described with reference to FIGS. 1-6.

In some examples, an apparatus as described herein may perform a method or methods, such as the method 700. The apparatus may include features, means, or instructions (e.g., a non-transitory computer-readable medium storing instructions executable by a processor) for forming a via that extends through a dielectric material, where the dielectric material is disposed between the via and a set of materials for a memory array, forming a first material above the set of materials for the memory array and the via, forming a first metal layer above the first material, where the first metal layer is for an access line for the memory array, planarizing a top surface of the first metal layer, and forming a second metal layer for the access line above the first metal layer.

In some examples of the method 700 and the apparatus described herein planarizing the top surface of the first metal layer removes a portion of the first metal layer and a portion of the first material to expose a top surface of the via.

In some examples of the method 700 and the apparatus described herein, planarizing the top surface of the first metal layer may include applying a CMP process to the top surface of the first metal layer.

Some examples of the method 700 and the apparatus described herein may further include operations, features, means, or instructions for applying, before forming the first material, a first planarization process to a top surface of the dielectric material and a top surface of the via, where the top surface of the via may be protruded above the top surface of the dielectric material by a first height after the first planarization process.

In some examples of the method 700 and the apparatus described herein, the first planarization process removes a material included in the via at a first rate, and the first planarization process removes the dielectric material at a second rate that may be faster than the first rate.

In some examples of the method 700 and the apparatus described herein, the first planarization process may be applied to a top surface of a second dielectric material included in the set of materials for the memory array, and the first planarization process removes the second dielectric material at a third rate that may be faster than the first rate.

Some examples of the method 700 and the apparatus described herein may further include operations, features, means, or instructions for removing, before the first planarization process may be applied, a portion of the dielectric material using an etch process, where the top surface of the via may be protruded above the top surface of the dielectric material by a second height after the etch process, and where the second height may be less than the first height.

Some examples of the method 700 and the apparatus described herein may further include operations, features, means, or instructions for applying, before applying the first planarization process, a second planarization process to the top surface of the dielectric material and the top surface of the via, where the top surface of the via may be protruded above the top surface of the dielectric material by a third height after the second planarization process, and where the third height less than the first height.

In some examples of the method 700 and the apparatus described herein, the via protrudes from the dielectric material by a first height before the first material may be formed, and the first material may be formed with a thickness that may be less than the first height.

In some examples of the method 700 and the apparatus described herein, the first metal layer may be formed with a second thickness, and the thickness plus the second thickness may be greater than the first height.

In some examples of the method 700 and the apparatus described herein, the second metal layer may be formed with a third thickness that is greater than the second thickness.

In some examples of the method 700 and the apparatus described herein, the first material and the first metal layer may remain above the set of materials for the memory array after the planarizing.

In some examples of the method 700 and the apparatus described herein, the first material may remain on a sidewall of the via after the planarizing.

In some examples of the method 700 and the apparatus described herein, the top surface of the first metal layer may be level with a top surface of the via after the planarizing.

In some examples of the method 700 and the apparatus described herein, the second metal layer may be in contact with a top surface of the via after the second metal layer is formed.

In some examples of the method 700 and the apparatus described herein, the first material may have a higher resistivity than the first metal layer and the second metal layer.

In some examples of the method 700 and the apparatus described herein, the first material may include tungsten silicon nitride, and the first metal layer and the second metal layer may both include tungsten.

In some examples of the method 700 and the apparatus described herein, the set of materials may include a chalcogenide material for one or more storage elements of the memory array.

Figure 8:
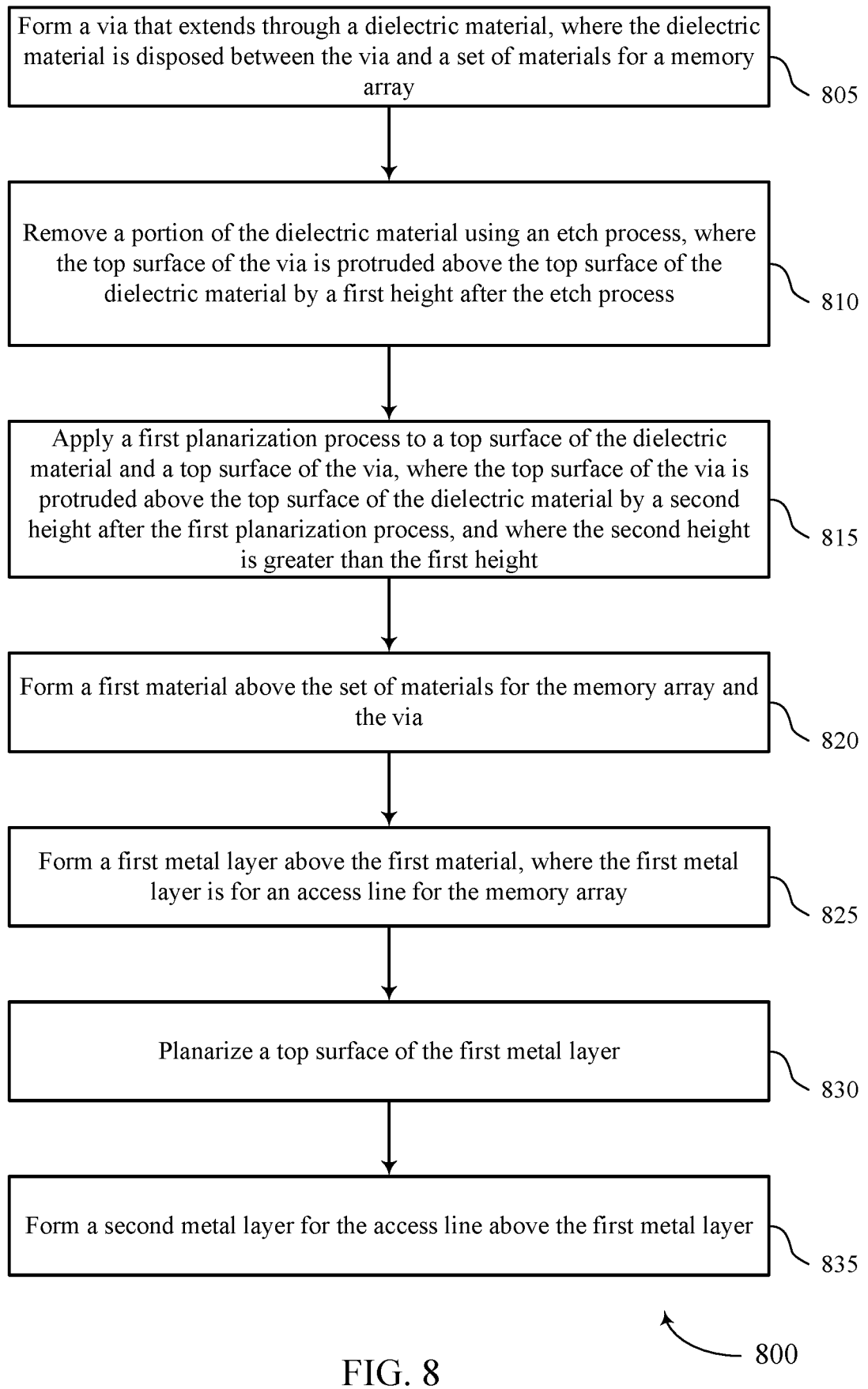

FIG. 8 shows a flowchart illustrating a method or methods 800 that supports low resistance via contacts in a memory device in accordance with aspects of the present disclosure. The operations of method 800 may be used to form a memory device or its components as described herein. For example, the operations of method 800 may be implemented by the fabrication techniques as described with reference to FIGS. 1-6.

At 805, a via that extends through a dielectric material may be formed, where the dielectric material is disposed between the via and a set of materials for a memory array. The operations of 805 may be performed according to the methods described herein. In some examples, aspects of the operations of 805 may be performed using fabrication techniques as described with reference to FIGS. 1-6.

At 810, a portion of the dielectric material may be removed using an etch process, where the top surface of the via is protruded above the top surface of the dielectric material by a first height after the etch process. The operations of 810 may be performed according to the methods described herein. In some examples, aspects of the operations of 810 may be performed using fabrication techniques as described with reference to FIGS. 1-6.

At 815, a first planarization process may be applied to a top surface of the dielectric material and a top surface of the via, where the top surface of the via is protruded above the top surface of the dielectric material by a second height after the first planarization process, and where the second height is greater than the first height. The operations of 815 may be performed according to the methods described herein. In some examples, aspects of the operations of 815 may be performed using fabrication techniques as described with reference to FIGS. 1-6.

At 820, a first material above the set of materials for the memory array and the via may be formed. The operations of 820 may be performed according to the methods described herein. In some examples, aspects of the operations of 820 may be performed using fabrication techniques as described with reference to FIGS. 1-6.

At 825, a first metal layer above the first material may be formed, where the first metal layer is for an access line for the memory array. The operations of 825 may be performed according to the methods described herein. In some examples, aspects of the operations of 825 may be performed using fabrication techniques as described with reference to FIGS. 1-6.

At 830, a top surface of the first metal layer may be planarized. The operations of 830 may be performed according to the methods described herein. In some examples, aspects of the operations of 830 may be performed using fabrication techniques as described with reference to FIGS. 1-6.

At 835, a second metal layer for the access line above the first metal layer may be formed. The operations of 835 may be performed according to the methods described herein. In some examples, aspects of the operations of 835 may be performed using fabrication techniques as described with reference to FIGS. 1-6.

Figure 9:
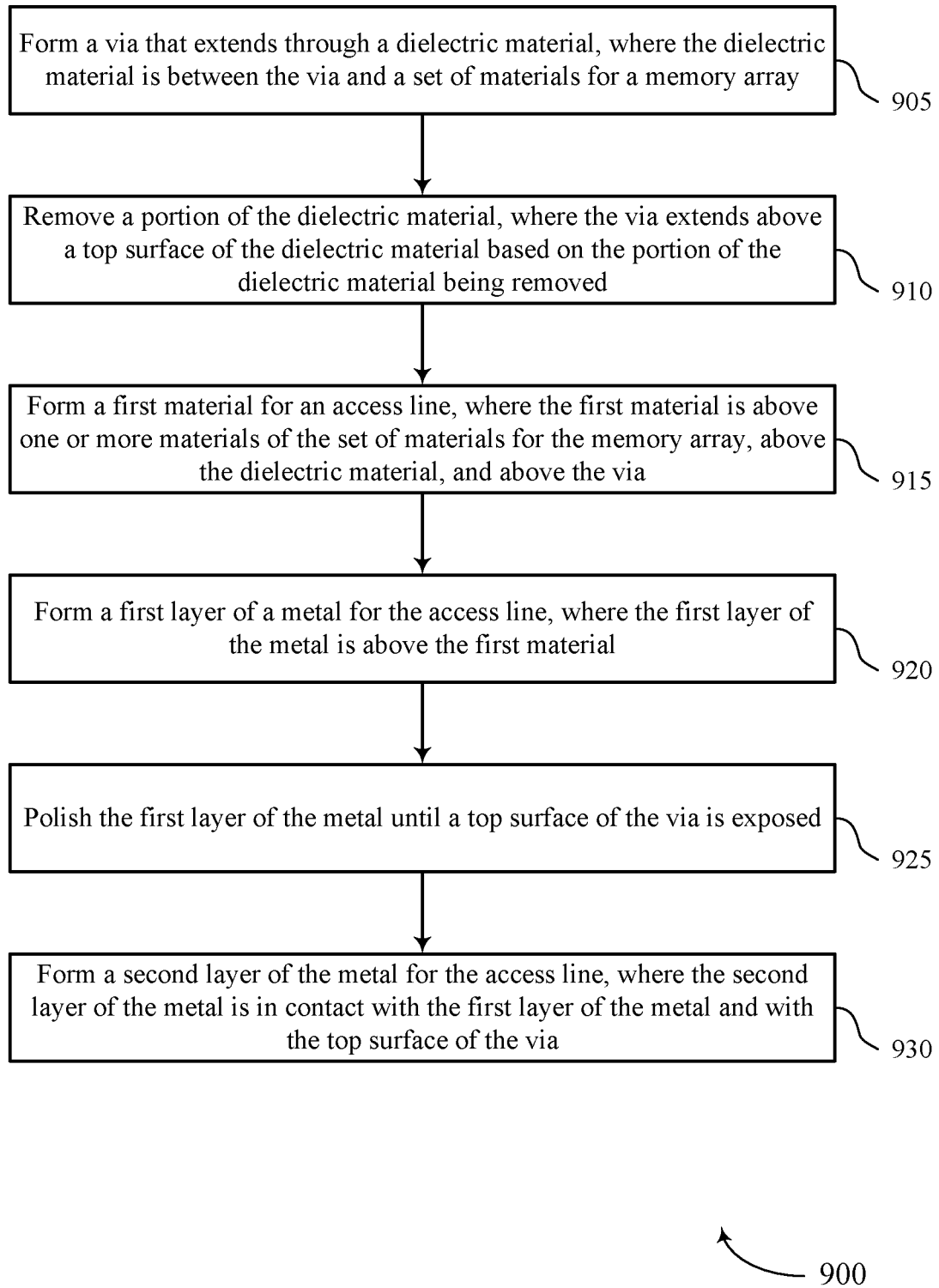

FIG. 9 shows a flowchart illustrating a method or methods 900 that supports low resistance via contacts in a memory device in accordance with aspects of the present disclosure. The operations of method 900 may be used to form a memory device or its components as described herein. For example, the operations of method 900 may be implemented by the fabrication techniques as described with reference to FIGS. 1-6

At 905, a via that extends through a dielectric material may be formed, where the dielectric material is between the via and a set of materials for a memory array. The operations of 905 may be performed according to the methods described herein. In some examples, aspects of the operations of 905 may be performed using fabrication techniques as described with reference to FIGS. 1-6.

At 910, a portion of the dielectric material may be removed, where the via extends above a top surface of the dielectric material based on the portion of the dielectric material being removed. The operations of 910 may be performed according to the methods described herein. In some examples, aspects of the operations of 910 may be performed using fabrication techniques as described with reference to FIGS. 1-6.

At 915, a first material for an access line may be formed, where the first material is above one or more materials of the set of materials for the memory array, above the dielectric material, and above the via. The operations of 915 may be performed according to the methods described herein. In some examples, aspects of the operations of 915 may be performed using fabrication techniques as described with reference to FIGS. 1-6.

At 920, a first layer of a metal for the access line may be formed, where the first layer of the metal is above the first material. The operations of 920 may be performed according to the methods described herein. In some examples, aspects of the operations of 920 may be performed using fabrication techniques as described with reference to FIGS. 1-6.

At 925, the first layer of the metal may be polished until a top surface of the via is exposed. The operations of 925 may be performed according to the methods described herein. In some examples, aspects of the operations of 925 may be performed using fabrication techniques as described with reference to FIGS. 1-6.

At 930, a second layer of the metal for the access line may be formed, where the second layer of the metal is in contact with the first layer of the metal and with the top surface of the via. The operations of 930 may be performed according to the methods described herein. In some examples, aspects of the operations of 930 may be performed using fabrication techniques as described with reference to FIGS. 1-6.

In some examples, an apparatus as described herein may perform a method or methods, such as the method 900. The apparatus may include features, means, or instructions (e.g., a non-transitory computer-readable medium storing instructions executable by a processor) for forming a via that extends through a dielectric material, where the dielectric material is between the via and a set of materials for a memory array, removing a portion of the dielectric material, where the via extends above a top surface of the dielectric material based on the portion of the dielectric material being removed, forming a first material for an access line, where the first material is above one or more materials of the set of materials for the memory array, above the dielectric material, and above the via, forming a first layer of a metal for the access line, where the first layer of the metal is above the first material, polishing the first layer of the metal until a top surface of the via is exposed, and forming a second layer of the metal for the access line, where the second layer of the metal is in contact with the first layer of the metal and with the top surface of the via.

In some examples of the method 900 and the apparatus described herein, polishing the top surface of the first layer of the metal may include operations, features, means, or instructions for applying a CMP process that removes a portion of the first layer of the metal and a portion of the first material.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include an array of memory cells, a via that extends through a dielectric material, where the dielectric material is disposed between the array of memory cells and the via, a first material above the array of memory cells and the dielectric material, where the via protrudes from the dielectric material by a height that is greater than a thickness of the first material above the array of memory cells, and an access line above the first material, where the access line extends from above the array of memory cells to above the via, and where the access line is in contact with a top surface of the first material and a top surface of the via.

In some examples, a portion of the access line may be lower than the top surface of the via.

In some examples, the first material may be in contact with a sidewall of the via, and a portion of the first material may be between the sidewall of the via and a portion of the access line.

In some examples, the access line includes a first metal sublayer and a second metal sublayer, and the height by which the via protrudes from the dielectric material may be equal to a combined thickness of the first material and the first metal sublayer.

In some examples, the first material includes a metal nitride, a metal silicide, or a metal silicon nitride.

In some examples, the access line includes tungsten, tungsten nitride, aluminum, tantalum, or molybdenum.

Some examples of the apparatus may include a second dielectric material that may be different than the dielectric material and disposed between memory cells of the array, where the first material may be in contact with the memory cells of the array and with the second dielectric material.

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory arrays.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

As used herein, the term "substantially" means that the modified characteristic (e.g., a verb or adjective modified by the term substantially) need not be absolute but is close enough to achieve the advantages of the characteristic.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The term "exemplary" used herein means "serving as an example, instance, or illustration," and not "preferred" or "advantageous over other examples."

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), or platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include GexTey, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    forming a via that extends through a dielectric material, wherein the dielectric material is disposed between the via and a set of materials for a memory array;
    forming a first material above the set of materials for the memory array and the via;
    forming a first metal layer above the first material, wherein the first metal layer is for an access line for the memory array;
    planarizing a top surface of the first metal layer; and
    forming a second metal layer for the access line above the first metal layer.

2. The method of claim 1, wherein:
    planarizing the top surface of the first metal layer removes a portion of the first metal layer and a portion of the first material to expose a top surface of the via.

3. The method of claim 1, wherein planarizing the top surface of the first metal layer comprises:
    applying a chemical-mechanical planarization (CMP) process to the top surface of the first metal layer.

4. The method of claim 1, further comprising:
    applying, before forming the first material, a first planarization process to a top surface of the dielectric material and a top surface of the via, wherein the top surface of the via is protruded above the top surface of the dielectric material by a first height after the first planarization process.

5. The method of claim 4, wherein:
    the first planarization process removes a material included in the via at a first rate; and
    the first planarization process removes the dielectric material at a second rate that is faster than the first rate.

6. The method of claim 5, wherein:
    the first planarization process is applied to a top surface of a second dielectric material included in the set of materials for the memory array; and
    the first planarization process removes the second dielectric material at a third rate that is faster than the first rate.

7. The method of claim 4, further comprising:
    removing, before the first planarization process is applied, a portion of the dielectric material using an etch process, wherein the top surface of the via is protruded above the top surface of the dielectric material by a second height after the etch process, and wherein the second height is less than the first height.

8. The method of claim 4, further comprising:
    applying, before applying the first planarization process, a second planarization process to the top surface of the dielectric material and the top surface of the via, wherein the top surface of the via is protruded above the top surface of the dielectric material by a third height after the second planarization process, and wherein the third height less than the first height.

9. The method of claim 1, wherein:
the via protrudes from the dielectric material by a first height before the first material is formed; and
the first material is formed with a thickness that is less than the first height.

10. The method of claim 1, wherein the first material and the first metal layer remain above the set of materials for the memory array after the planarizing.

11. The method of claim 1, wherein the first material remains on a sidewall of the via after the planarizing.

12. The method of claim 1, wherein the top surface of the first metal layer is level with a top surface of the via after the planarizing.

13. The method of claim 1, wherein the second metal layer is in contact with a top surface of the via after the second metal layer is formed.

14. The method of claim 1, wherein the first material has a higher resistivity than the first metal layer and the second metal layer.

15. The method of claim 1, wherein:
the first material comprises tungsten silicon nitride; and
the first metal layer and the second metal layer both comprise tungsten.

16. The method of claim 1, wherein the set of materials comprises a chalcogenide material for one or more storage elements of the memory array.

17. A method, comprising:
forming a via that extends through a dielectric material, wherein the dielectric material is between the via and a set of materials for a memory array;
removing a portion of the dielectric material, wherein the via extends above a top surface of the dielectric material based at least in part on the portion of the dielectric material being removed;
forming a first material for an access line, wherein the first material is above one or more materials of the set of materials for the memory array, above the dielectric material, and above the via;
forming a first layer of a metal for the access line, wherein the first layer of the metal is above the first material;
polishing the first layer of the metal until a top surface of the via is exposed; and
forming a second layer of the metal for the access line, wherein the second layer of the metal is in contact with the first layer of the metal and with the top surface of the via.

18. The method of claim 17, wherein polishing the top surface of the first layer of the metal comprises:
applying a chemical-mechanical planarization (CMP) process that removes a portion of the first layer of the metal and a portion of the first material.

\* \* \* \* \*